(12) United States Patent
Danovitch et al.

(10) Patent No.: US 6,819,566 B1
(45) Date of Patent: Nov. 16, 2004

(54) GROUNDING AND THERMAL DISSIPATION FOR INTEGRATED CIRCUIT PACKAGES

(75) Inventors: David Danovitch, Canton de Granby (CA); Eric Duchesne, Granby (CA)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/605,752

(22) Filed: Oct. 23, 2003

(30) Foreign Application Priority Data

Oct. 25, 2002 (CA) .............................................. 2409912

(51) Int. Cl.[7] ................................................ H05K 7/20
(52) U.S. Cl. ...................... 361/704; 361/707; 361/709; 361/719; 257/706; 257/712; 257/719
(58) Field of Search ................................. 361/704, 707, 361/709, 719–721, 816, 818; 257/704, 706, 712–719; 165/80.3, 185

(56) References Cited

U.S. PATENT DOCUMENTS

| | | | |
|---|---|---|---|
| 5,371,321 A | 12/1994 | Hamzehdoost et al. | |
| 5,561,085 A | * 10/1996 | Gorowitz et al. | 438/125 |
| 5,608,610 A | * 3/1997 | Brzezinski | 361/704 |
| 5,955,789 A | 9/1999 | Vendramin | |
| 6,043,560 A | 3/2000 | Haley et al. | |
| 6,166,435 A | * 12/2000 | Leu et al. | 257/704 |
| 6,177,727 B1 | 1/2001 | Hart, Jr. et al. | |
| 6,208,526 B1 | 3/2001 | Griffin et al. | |
| 6,225,694 B1 | 5/2001 | Terui | |
| 6,229,404 B1 | 5/2001 | Hatanaka | |
| 6,243,265 B1 | 6/2001 | Wong et al. | |
| 6,257,904 B1 | 7/2001 | Lin | |
| 6,282,095 B1 | * 8/2001 | Houghton et al. | 361/704 |
| 6,599,779 B2 | * 7/2003 | Shim et al. | 438/122 |
| 6,630,725 B1 | * 10/2003 | Kuo et al. | 257/659 |
| 6,707,168 B1 | * 3/2004 | Hoffman et al. | 257/796 |

* cited by examiner

*Primary Examiner*—Boris Chervinsky
(74) *Attorney, Agent, or Firm*—Todd M. C. Li

(57) ABSTRACT

In a microelectronic chip package for which grounding and thermal dissipation is desired, a cover is provided having an opening which is aligned with a contact on the substrate connected to ground potential. The cover is connected to the electronic device and the ground contact. This invention provides for a method and electronic package to overcome the difficulties encountered when attempting to simultaneously attach a cover to two different surfaces with two different adhesives.

8 Claims, 5 Drawing Sheets

GROUNDING AND THERMAL DISSIPATION FOR INTEGRATED CIRCUIT PACKAGES

BACKGROUND OF INVENTION

This invention relates to improved electronic packages and in particular, improved methods and devices for providing grounding and thermal dissipation in such packages.

In the manufacture of electronic circuit assemblies, substrates or circuit boards contain electronic components, integrated circuits or chips, and other devices mounted thereon. The assemblies are then encapsulated into packages.

In a typical microelectronic chip package construction, a cover, plate or lid, which is usually electrically and thermally conducting, is attached, by means of adhesive, to a chip which has been previously joined to the substrate. In this description the terms cover, plate or lid are intended to be used interchangeably to refer to the same elements. The adhesive material is often thermally conductive. The adhesive is deposited on the chip and the lid is then placed in contact with the adhesive and the adhesive is subsequently cured to provide a permanent connection of the cover plate to the chip. This arrangement results in the cover plate providing protection for the chip and also acting as a heat sink to conduct unwanted heat away from the chip. Good thermal conductivity requires a thin, uniform adhesive bond layer between the lid and the chip.

For example, with reference to FIG. 1, a typical flip chip electronic ball grid array package 10 is shown. Chip 11 has a plurality of solder bumps 12 for connecting to corresponding pads (not shown) on a surface of substrate 13. Solder balls 14 are provided on the underside of substrate 13 in order to attach the package to other circuitry on a substrate or circuit board. Chip 11 is electrically connected by means of the chip solder bumps 12 and conductive circuitry through substrate 13 to solder balls 14 in a well known manner. Chip 11 is sealed to substrate 13 by underfill 15 and possibly other encapsulating material as is known in the art. Cover plate or lid 16 is attached to the upper surface of chip 11 as shown by means of thermally conductive adhesive 17. Typically, adhesive 17 is applied to the upper surface of chip 11, lid 16 is placed thereon and the adhesive is subsequently cured. Lid 16 provides physical protection for chip 11 and also in conjunction with the thermally conductive adhesive 17 acts as a heat sink to dissipate unwanted heat that is generated by the electronic device or chip 11. Good thermal conductivity between chip 11 and lid 16 requires adhesive 17 to be in the form of a relatively thin and uniform adhesive bond line between lid 16 and chip 11.

Present day electronic circuitry components require the presence of radiation shielding or electromagnetic interference (EMI) protection, either to prevent radiation of electromagnetic waves from the active circuit components or to prevent interference to the components from external sources. In view of this requirement, it is sometimes desirable to electrically connect the lid to one or more ground connections existing on the substrate. Typically, conductive regions on the substrate are linked to ground pads, an electrically conductive adhesive is then applied to the pads and the conductive lid is placed on the chip so as to contact the conductive adhesive. Typically, the thermally conductive adhesive is applied to the chip and the electrically conductive adhesive is applied to the pads and the lid is attached to both of the adhesives at the same time, followed by a step of curing both of the adhesive materials. In order to accommodate construction tolerances for the electronic package, the design space between these ground pads and the lid is much greater than the desired thickness of the lid to chip layer for the thermally conductive adhesive. These differences demand the use of different types of adhesives with different rheological properties.

When attempting to simultaneously attach the lid to two different surfaces with two different adhesives, difficulties are typically encountered which require compromises in the lid to chip bond line thickness, or in other words, the thickness of the adhesive layer between the lid and the chip, lid to chip adhesive run-off, and excessive lid to ground pad adhesive spread are varied.

For example, referring to FIG. 2, the relatively simple structure of FIG. 1 is reproduced showing a typical prior art arrangement for providing for both electromagnetic interference protection for chip 11 as well as minimizing electromagnetic radiation. Ground pad 18 as shown, for example, on the upper surface of substrate 13, is electrically connected to ground potential as by circuitry through substrate 13 to one or more solder balls 14, as is well known. Electrically conductive adhesive 19 connects ground pad 18 to lid 16. Conventionally, electrically conductive material 19 is deposited on ground pad 18 in the same operation that the chip to lid adhesive 17 is deposited on chip 11 and then lid 16 is placed so as to contact both adhesive layers 17 and 19 at the same time followed by a step to cure both of the adhesives layers. As a result of physical tolerances required in the design of electronic packages, the space between ground pads 18 and lid 16 is much greater than the thickness of the lid to chip bond line between chip 11 and lid 16. Thus, it is apparent that in the processes of attaching lid 16 to the two different surfaces, namely chip 11 and ground pad 18, difficulties may be encountered such as the differences in the thickness of the lid to chip bond line between chip 11 and lid 16 or the run-off of adhesive 17 such that adhesive does not effectively remain on the surface of chip 11 or excess spreading of adhesive 19.

As an alternative to the use of conductive adhesive for the connection of the lid to the ground pad, the lid to ground pad connection may be achieved with solder. In view of the relatively large spacing as described above, the use of solder demands a relatively large amount of solder to be pre-deposited on the lid or on the ground pads themselves. However, alignment must be somehow predetermined between the solderable regions as the bottom side of the lid is not visible and this blind bottom side of the lid is to be soldered to the substrate ground pads. Any variations in deposited solder volume may result in either incomplete or absent lid to chip bond line or incomplete or absent lid to ground pad connection and thereby preventing the cover plate from properly functioning as a heat sink or to provide EMI protection.

As had been previously described, the ground pad lid connection may be made out of solder and comparable difficulties are experienced with the use of solder instead of conductive adhesive, resulting in incomplete or absent connections between the lid to chip bond line, or the lid to ground pad connection.

SUMMARY OF INVENTION

The present invention is directed to eliminating the difficulties in attaching a cover plate to a microelectronic chip package as described above as well as other shortcomings resulting from existing technology. The present invention has the object to provide methods and electronic packages which alleviate the above drawbacks.

According to one aspect of the present invention there is provided an electronic package containing an electronic device and a cover plate for providing thermal dissipation and electrical shielding for said electronic device. The package comprises a substrate, at least one electronic device mounted on said substrate and said substrate has a contact thereon for connecting to ground potential. A cover is provided for said electronic device has an opening therein which is positionally aligned with the contact. A thermal connection is provided between said electronic device and said cover and an electrical connection is provided proximate to said opening in the cover and the contact on the substrate.

According to another aspect of the present invention there is provided a method for assembling an electronic package which includes an electronic device and provides thermal dissipation and electrical shielding for the electronic device. The method comprises the steps of mounting an electronic device on a substrate wherein said substrate has a contact for connection to ground potential located thereon and positioning a cover over said electronic device wherein said cover has an opening therein and positionally aligning the opening of the cover with the contact on said substrate. The cover is then attached to the electronic device and electrically connected to the contact by way of the opening in the cover.

BRIEF DESCRIPTION OF DRAWINGS

The above and other advantages of the present invention will be better understood with reference to the following drawings, wherein like reference numbers represent like elements of the invention embodiments.

DETAILED DESCRIPTION

Figure 1:
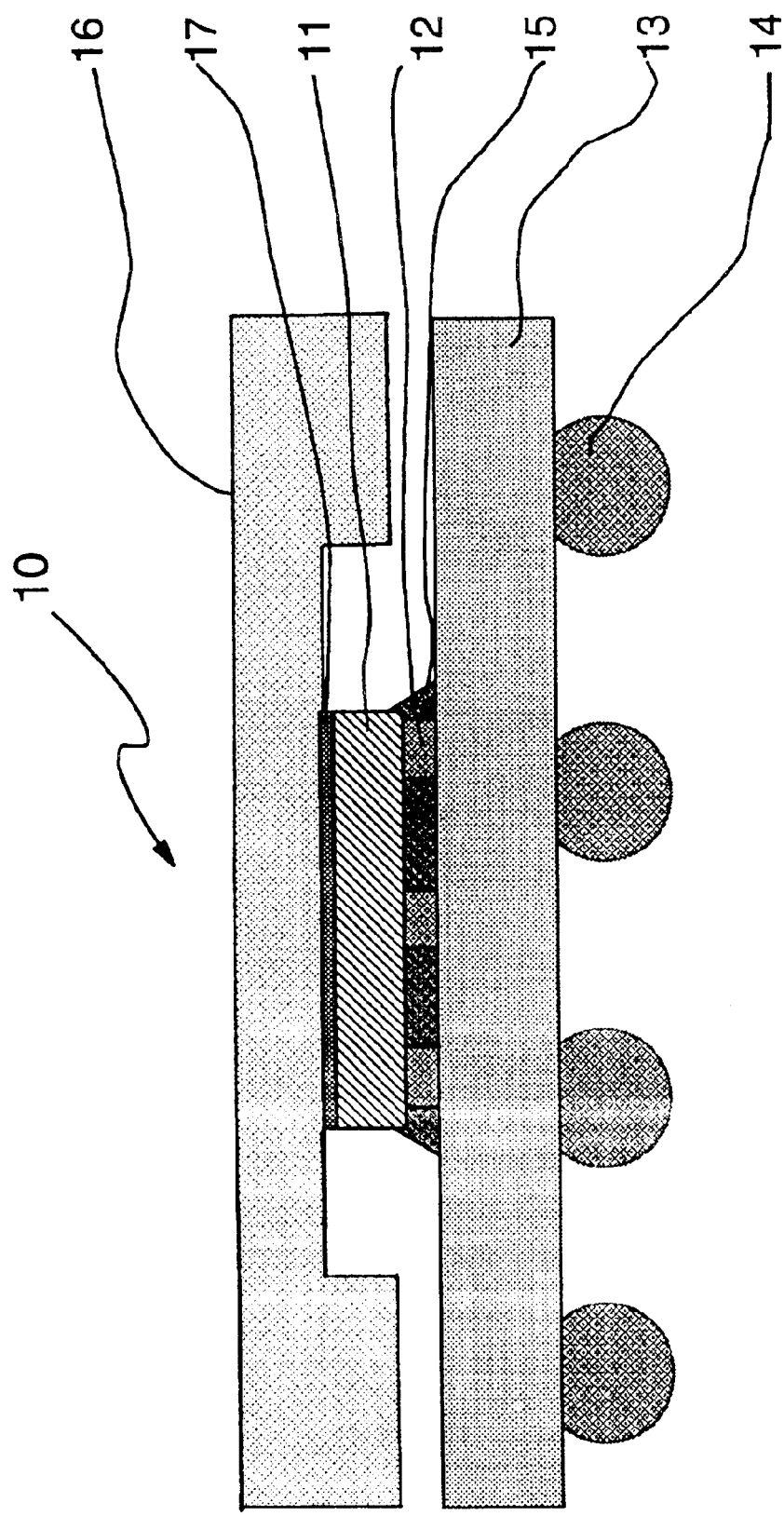
FIG. 1 is a cross-sectional view of a representation of a typical flip chip ball grid array electronic package as exists in the prior art.
Figure 2:
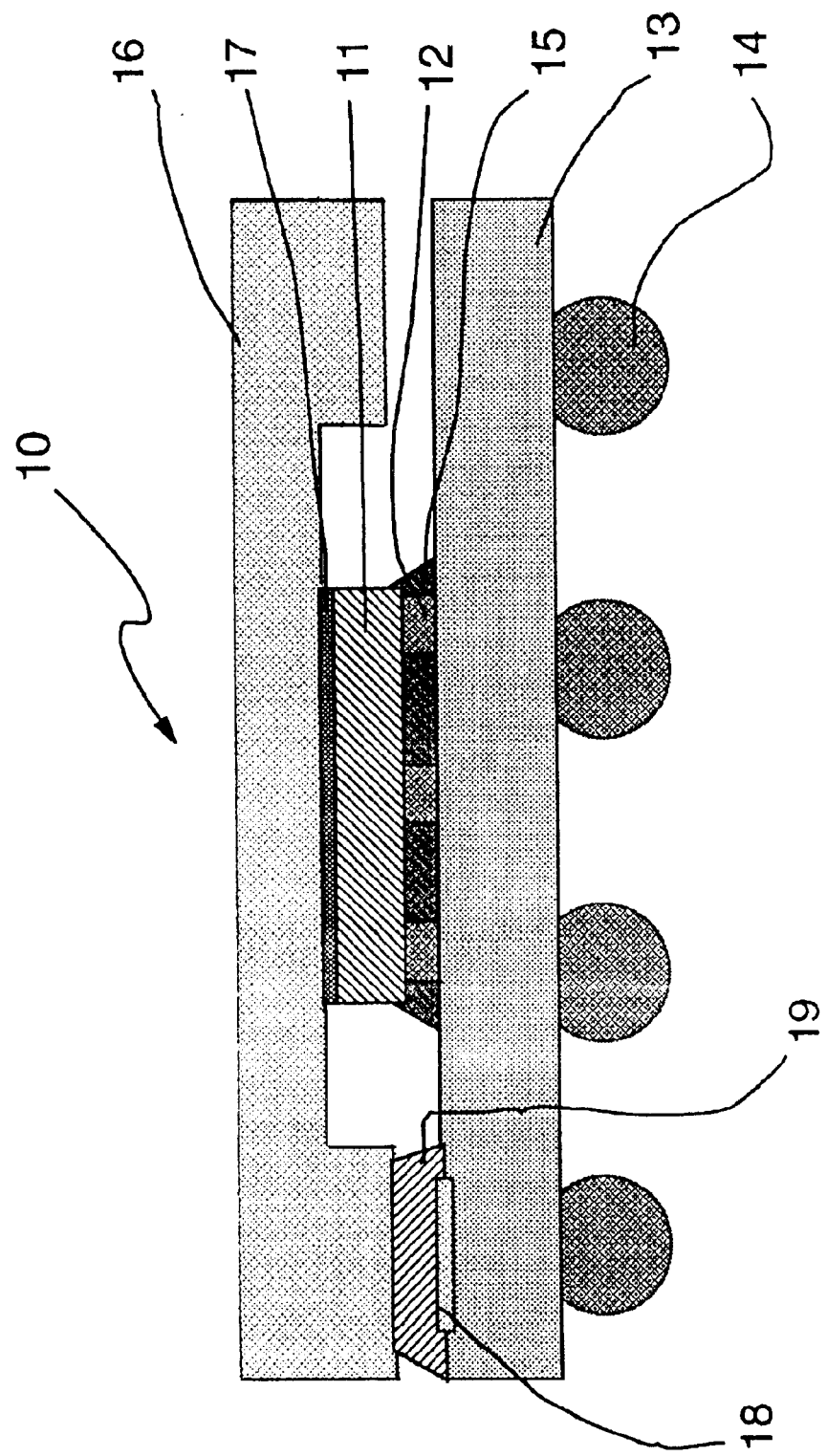
FIG. 2 is a similar cross-sectional view of the package of FIG. 1, showing a prior art arrangement for electrically grounding the lid to the substrate.
Figure 3:
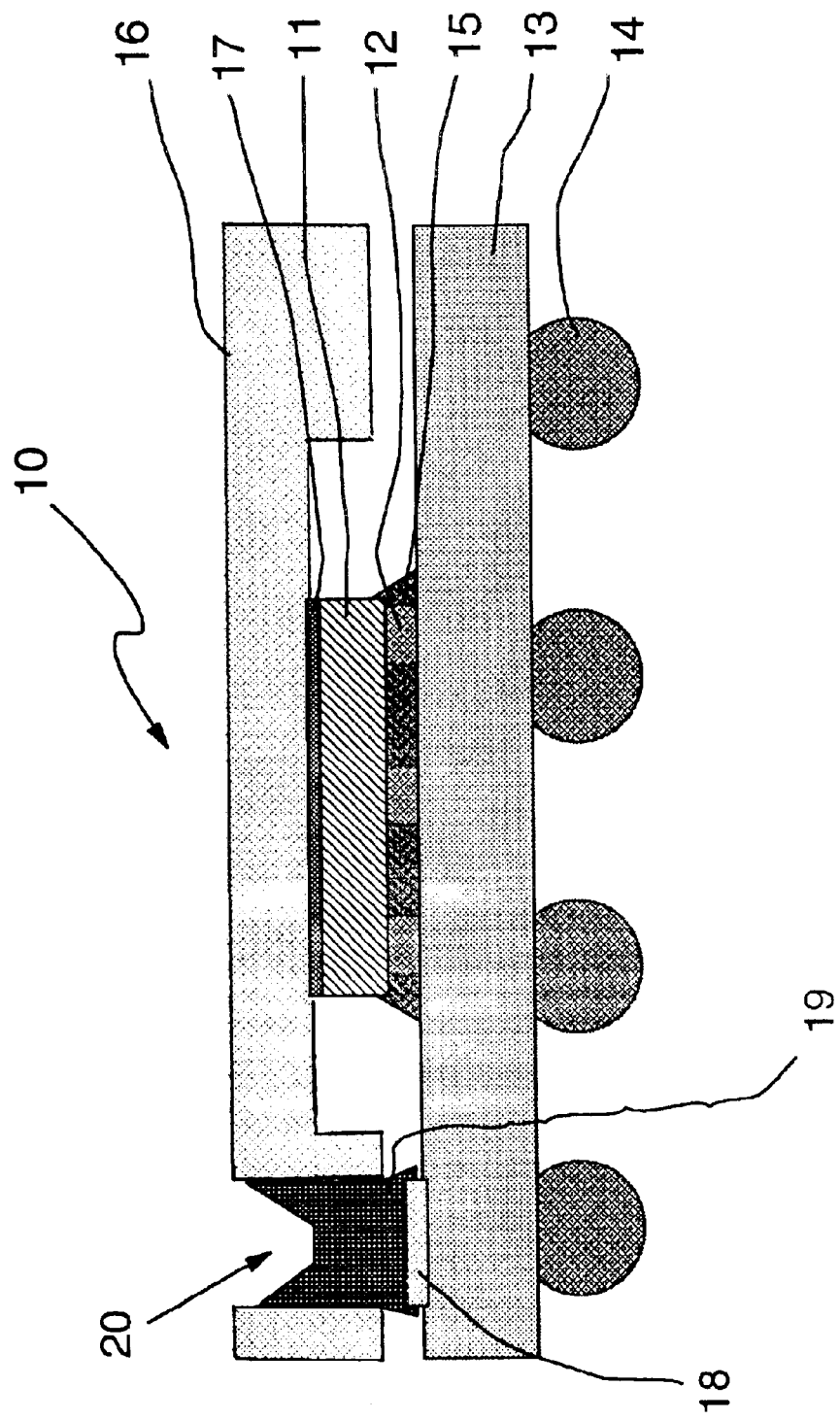
FIG. 3 is a cross-sectional view of a flip chip package providing one embodiment for electrically grounding the lid to the substrate in accordance with the present invention.

With reference to FIG. 3, aspects of a preferred embodiment of the present invention will be described which eliminates the above shortcomings of the prior art as discussed with reference to FIGS. 1 and 2. A hole or opening 20 is provided in lid 16 at one or more appropriate locations corresponding to ground pads 18 on substrate 13. Following traditional attachment of lid 16 to the top surface of chip 11, desired material 19 to electrically connect lid 16 to ground pad 18 is deposited into the hole or opening 20 of lid 16. This provides for an electrical ground connection between lid 16 and pad 18 of controlled shape and size. Of course, only one hole or opening 20 is shown in FIG. 3 but it is apparent that more than one hole could be employed to provide connection to more that one ground pad 18 as may be needed.

By providing one or more holes 20 in lid 16, the attachment of lid 16 to chip 11 may be achieved separately and independently from the attachment of lid 16 to ground pad 18 which then can be achieved in a controlled reproducible manner. For example, in the case of use of electrically conductive adhesive 19, the adhesive is dispensed in each lid hole 20 where the lid hole 20 is physically located in the x-y plane within the vicinity of, or proximate to, the substrate ground pad 18 corresponding to the hole 20 during the attachment of lid 16 to chip 11. Hole or opening 20 takes up any variation in volume of adhesive 19 that may have been applied and acts as a wicking up surface allowing a consistent shape of connection to ground pad 18, thereby preventing conductive adhesive from spreading to undesired regions of the surface of substrate 13 or in any manner of lifting or distorting lid 16 as lid 16 has already been attached to chip 11 with the cured adhesive 17. It stands to reason, therefore, that owing to the ability to control the spread of adhesive 19 that a smaller region of the surface of substrate 13 need be allocated for ground pad 18, thus saving and preserving surface real estate on substrate 13 for other purposes.

While the above describes actually curing the chip adhesive 17 in advance of the dispense and cure of adhesive 19 as an alternative, adhesive 17 could simply be initially partially cured in order to "gel" adhesive 17 to effectively fix both lid-chip position and lid-chip bond-line thickness, then deposit adhesive 19 in hole or opening 20, and then subsequently simultaneously cure the two adhesives 17 and 19.

The use of opening 20 in lid 16 can also accommodate the use of a solder connection between lid 16 and ground pad 18. This may be required because of stringent requirements for the resistivity or joint strength of the lid-pad connection. Holes 20 provide a simplified and controlled means to achieve a solder connection. With this approach, typically, no solder is required to be pre-deposited on lid 16 or substrate ground pad 18. In one preferred embodiment, hole 20 and ground pad 18 are designed to receive a standard solder ball or other preformed solder shape element or solder preform as are known to those familiar with this field, such that the solder element is simply dropped into opening 20 where the opening 20 has been physically located within the vicinity of the corresponding substrate ground pad 18 or positively aligned with pad 18, during the previous attachment of lid 16 to chip 11. Locating of lid 16 such that hole 20 is positioned over the corresponding ground pad 18 is simply achieved in that there is no blind bottom side of lid 20 to be aligned with ground pad 18 as lid 16 can be positioned so as to visually positionally align hole 20 with pad 18 from above. In this embodiment, soldering of lid or cover 16 to ground pad 18 is achieved during subsequent attachment of solder balls 14 to substrate 13 which typically is performed after lid 16 is attached to chip 11 in a ball grid array product and therefore would not require any additional solder reflow step. Alternatively, soldering of lid or cover 16 to ground pad 18 may also be achieved during subsequent attachment of solder balls 14 of substrate 13 to a circuit board which is also typically performed after lid 16 is attached to chip 11 in a ball grid array product and therefore would not require any additional solder reflow step. The solderable inside surface of hole 20 serves to wick any excess molten solder and thus accommodate any variation in spacing between substrate 13 and lid 16 in the vicinity of the ground pad 18. The soldered inside surface of opening 20 of lid 16 constitutes a region of the subsequent solder joint, thus increasing the joint integrity between ground pad 18 and lid 16. This may also allow for the design of physically smaller regions for ground pad 18 on the surface of substrate 13.

Flux may or may not be necessary for the attachment of lid 16 to pad 18, depending upon the nature of the solder element and the surfaces of ground pad 18 and hole 20. As an alternative to this embodiment, the solder element may be replaced with a controlled volume of solder paste which is dispensed into hole 20. In addition, it is apparent that flux or paste (which contains flux) depending upon their nature and the subsequent solder ball attachment processes used, may or may not require a separate cleaning process to remove flux residues after attachment.

Figure 4:
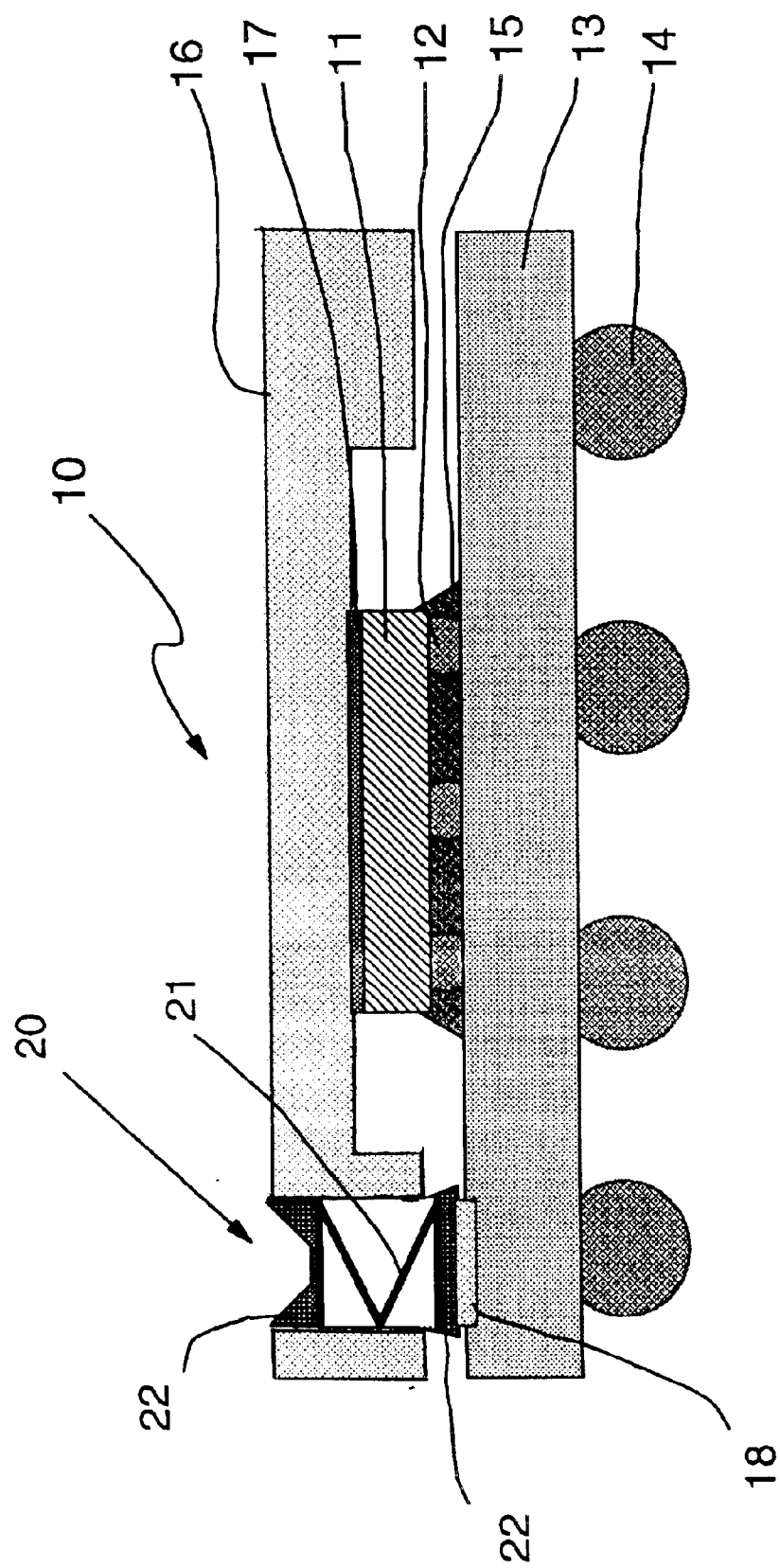
FIG. 4 is a representation of a cross-sectional view of a flip chip package showing an alternative embodiment of the invention.

The existence of one or more openings 20 in lid or cover 16 provides for various forms of electrical and physical connections between lid 16 and ground pad 18. If the design of the electronic package 10 requires a more compliant connection between lid 16 and one or more ground pads 18 than what is achievable with a fixed adhesive or solder connection as previously described, a compliant member 21 as shown in FIG. 4, such as a spiral or leave connector made out of spring material, may be placed in opening 20 of lid 16 where the opening 20 has been designed to be physically located proximate to the area of the corresponding ground pad 18 on substrate 13 during the attachment of lid 16 to chip 11. By providing such a compliant member 21 with pre-soldered regions at each extremity thereof, compliant member 21 will be readily soldered to both lid 16 and ground pad 18 as shown by soldered connections 22 during the subsequent solder flow process of attaching solder balls 14 to the substrate 13 or circuit board. The attachment of compliant member 21 in this manner maintains compliance between the two soldered connections 22. With the approach as described for this aspect of the embodiment of the invention, minimal pre-alignment, pre-placing or pre-solder attachment is required between compliant member 21 and lid 16. In addition, no pressure is required to be applied between lid 16 and substrate 13 to ensure the compliant member 21 appropriately contacts lid 16 and ground pad 18 during the attachment of lid 16 to chip 11 since the placement of compliant member 21 and the soldering of compliant member 21 to lid 16 and ground pad 18 is achieved subsequent to and separate from the process of attachment of cover 16 to chip 11. Furthermore, there is no adverse requirement, for example, to blindly align compliant member 21 to ground pad 18 from the bottom surface of cover 16 as the connection is visible from the top of opening 20.

Figure 5:
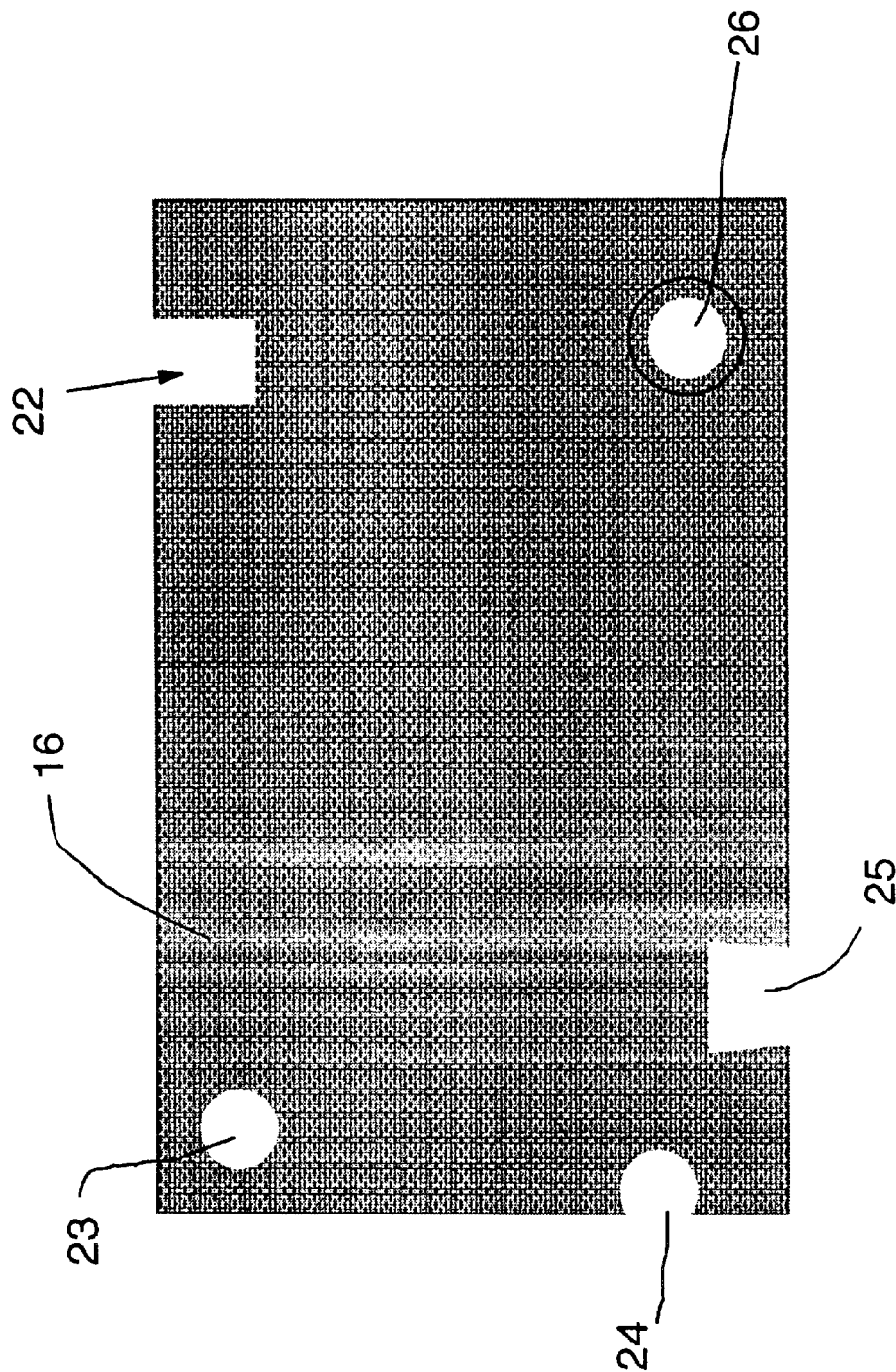
FIG. 5 is a diagram of a lid or cover plate for an electronic package showing a variety of configurations of the openings in the lid or cover which could be used as part of the invention.

Pre-fabricated openings in cover 16 have been implied in the above description to illustrate the concepts of the present invention. With reference to FIG. 5, these openings may be of any shape or partial shape hole such as a slot 22, round opening 23, partial round hole 24, angles slot 25 or a hole 26 which is countersunk that is formed or created in lid 16 prior to attachment of lid 16 to chip 11 as described above. These openings or holes may be achieved by drilling, stamping, pre-forming or any other means known in the art. Any one or more of these shapes for the openings or holes in lid 16 may be used as may be appropriate in order to implement the present invention. This flexibility permits the advantages of affording superior control in the creation of the connection between cover 16 and ground pad connection 18 which is separate from the process of attaching lid 16 to chip 11.

Some examples of material compositions for cover or lid 16 will now be provided, but these examples are not limiting as would be familiar to those of ordinary skill in manufacture of electronic packages. Cover 16 may consist of copper (Cu) and in particular, oxygen-free electronic (OFE) grade pure copper. The copper may be plated with nickel (Ni) and in addition have selectively solderable surfaces inside the openings 20 of either the copper of the original material comprising cover 16 or some other deposited material such as gold (Au), palladium (Pd) or silver (Ag). As another alternative cover 16 could be made of aluminum (Al) with all surfaces anodized except for the surfaces of openings 20 which would be coated with an electrically conductive and optionally solderable material.

Any appropriate adhesives 17 and 19 that are known to those of ordinary skill in this art could be suitably used in the various described embodiments of the invention. The invention as described provides for significant latitude in the choice of adhesive 19 including wider volume range and viscosity properties. Examples of compositions for the electrically conductive adhesive 19 would consist of combinations of the following components 1, 2 and 3:

1. Polymers from one or more of the following families:
   Epoxy
   Acrylate
   Polyester
   Silicone
2. Electrically conductive particles consisting of one or more of the following materials:
   Silver
   Silver plated copper
   Silver plated aluminum
   Carbon
3. Low molecular weight molecules as hardeners, cross-linkers and viscosity regulators such as:
   epoxides
   silanes
   amines
   organic solvent
   PDMS Compliant member 21 could be a spring material made of berillium copper (BeCu) which could be obtained from suppliers including Brush-Wellman Inc., Fremont, Calif. and NGK Metals Corporation, Sweetwater, Tenn.

It will be understood from the foregoing description that various modifications and changes may be made to the preferred embodiment of the present invention without departing from its true intent and spirit. It is intended that this description is for purposes of illustration only and should not be construed in a limiting sense. The scope of this invention should be limited only by the language of follow.

What is claimed is:

1. An electronic package for providing thermal dissipation and electrical shielding for one or more electronic devices comprising:
   a substrate;
   at least one electronic device mounted on said substrate;
   a contact on said substrate for connecting to ground potential;
   a cover for said electronic device having an opening therein positionally aligned with said contact;
   a thermal connection between said electronic device and said cover; and
   an electrical connection proximate to said opening between said cover and said contact on said substrate.

2. The electronic package according to claim 1 wherein the electronic device is an integrated circuit device.

3. The electronic package according to claim 1 wherein said cover is made of electrically and thermally conductive material.

4. The electronic package according to claim 1 wherein said thermal connection is thermally conductive adhesive attaching said cover to said electronic device.

5. The electronic package according to claim 1 wherein the shape of said opening is selected from the group consisting of a slot, round hole, partial round hole, a countersunk hole and angled slot.

6. The electronic package according to claim 1 wherein said electrical connection is selected from the group consisting of conducting adhesive and solder.

7. The electronic package according to claim 1 wherein said electrical connection is a member connected to the cover and the contact on the substrate.

8. The electronic package according to claim 1 wherein said member is a compliant spring soldered to the cover and the contact.

* * * * *